United States Patent [19]

Tanaka

[11] Patent Number: 4,555,655
[45] Date of Patent: Nov. 26, 1985

[54] CHARGING/DISCHARGING CIRCUIT

[75] Inventor: Tatsuo Tanaka, Yokohama, Japan

[73] Assignee: Tokyo Shibaura Denki Kabushiki Kaisha, Japan

[21] Appl. No.: 592,857

[22] Filed: Mar. 23, 1984

[30] Foreign Application Priority Data

Mar. 31, 1983 [JP] Japan ................................. 58-56075

[51] Int. Cl.⁴ .............................................. H03G 3/00
[52] U.S. Cl. ........................................ 320/1; 307/109
[58] Field of Search ...................... 320/1; 330/7, 127; 307/109; 250/377, 378; 378/102, 103

[56] References Cited

U.S. PATENT DOCUMENTS

| 3,200,341 | 8/1965 | Relis | 320/1 X |
| 3,683,270 | 8/1972 | Mattis | 320/1 X |
| 3,805,146 | 4/1974 | Culley | 320/1 |
| 4,109,192 | 8/1978 | Burbank | 320/1 |
| 4,219,872 | 8/1980 | Engelmann | 320/1 X |

Primary Examiner—R. J. Hickey
Attorney, Agent, or Firm—Finnegan, Henderson, Farabow, Garrett & Dunner

[57] ABSTRACT

A charging/discharging circuit is formed of transistors Q1, Q2; resistors R1–R4; and a capacitor C. The series resistors R1, R2 are connected between the power supply line +Vcc and the circuit ground. The series resistors R3, R4 are connected between the line +Vcc and the circuit ground. The collector of NPN transistor Q1 is connected to +Vcc, the base thereof is connected to the junction between R3 and R4, and the emitter thereof is coupled to the junction between R1 and R2. The collector of PNP transistor Q1 is connected to the circuit ground, the base thereof is connected to the junction between R3 and R4, and the emitter thereof is coupled to the junction between R1 and R2. Capacitor C is connected in parallel to R2. The charged voltage of C is used as a reference potential VR for another linear circuit. Suppose that R1=R2, R3=R4 and +Vcc=10 V. When +Vcc rises from 0 V to 10 V but VR does not reach to 5 V, Q1 is forwardly biased so that C is quickly charged by the emitter current of Q1. When +Vcc falls from 10 V to 0 V but VR does not reach 0 V, Q2 is forwardly biased so that C is quickly discharged by the emitter current of Q2. When VR=5 V (stationary state), Q1 and Q2 are both cut-off, so that only small currents flow through the series circuits of R1, R2 and R3, R4. The time constant of (R1||R2).C can be made large so that VR is free from ripples of +Vcc.

14 Claims, 15 Drawing Figures

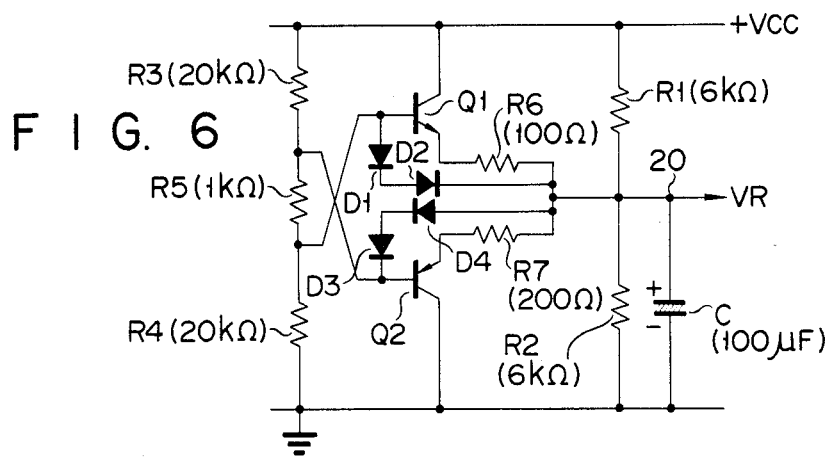
FIG. 6
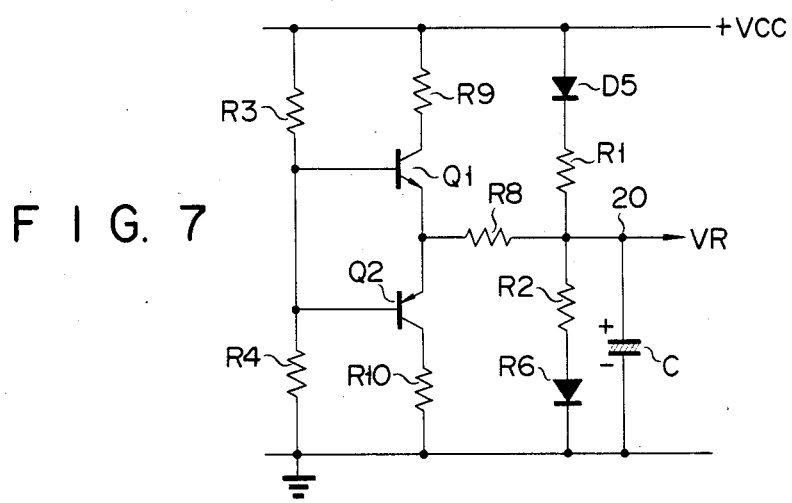
FIG. 7
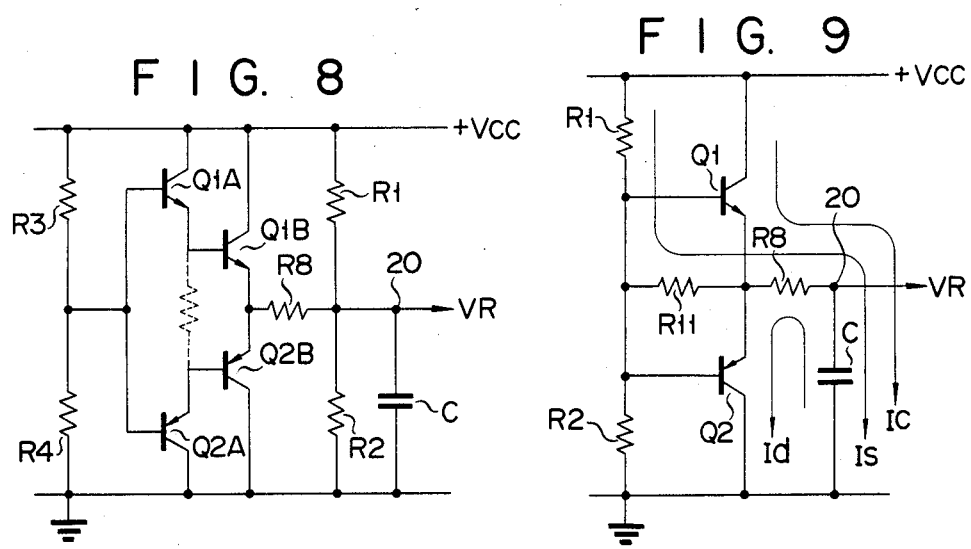
FIG. 8
FIG. 9

CHARGING/DISCHARGING CIRCUIT

BACKGROUND OF THE INVENTION

The present invention relates to a charging/discharging circuit suitably adapted for providing a center potential or reference potential of, e.g., a bipolar monolithic linear amplifier.

In a conventional charging/discharging circuit as shown in FIG. 1, a capacitor C is coupled in parallel to one of voltage dividing resistors R1 and R2. Resistors R1 and R2 divide a power supply voltage +Vcc to provide a reference potential VR. Reference potential VR is obtained from the junction node between resistors R1 and R2. Capacitor C serves to remove ripples from reference potential VR in a steady state. For improving a ripple rejection ratio of the charging/discharging circuit, the capacitance of capacitor C and/or the resistances of resistors R1 and R2 have to be sufficiently large. Meanwhile, in order to increase the rising or falling speed of reference potential VR at the time when the power supply is switched ON or OFF, the resistances of resistors R1 and R2 must be reduced so that charging and discharging time constant for capacitor C becomes small. However, when the resistances of resistors R1 and R2 are reduced, a current flowing through them is increased, resulting in large wasteful power comsumption. Thus, the above conventional circuit fails to satisfy, at the same time, the contradictory requirements for improvement of the ripple reduction ratio, increase of the rising/falling speed of reference potential VR and a low power consumption. Only one or two requirements can be satisfied while sacrificing or spoiling others.

SUMMARY OF THE INVENTION

It is accordingly the object of the present invention to provide a charging/discharging circuit which satisfies the contradictory requirements of a good ripple reduction ratio, a fast rising/falling speed of the reference potential and a low power consumption in the steady state.

To achieve the above object a charging/discharging circuit of the present invention includes a voltage divider coupled between a power supply circuit and a circuit ground, for voltage-dividing a power supply potential, and providing at an output node of the voltage divider a reference potential, a capacitor coupled between the output node of the voltage divider and the circuit ground, for eliminating ripples from the reference potential, a charging transistor coupled between the power supply circuit and the output node, for feeding a charge current from the power supply circuit to the capacitor when the power supply potential has a given high value and a potential at the output node is lower than a first given potential which corresponds to the reference potential, wherein the charging transistor stops the feeding of the charge current when the potential at the output node exceeds the first given potential, and a discharging transistor coupled between the circuit ground and the output node, for feeding a discharge current from the capacitor to the circuit ground when the power supply potentialhas a given low value and the potential at the output node exceeds a second given potential which is lower than the first given potential, wherein the discharging transistor stops the feeding of the discharge current when the potential at the output node is lower than the second given potential.

According to the circuit of the invention as described above, even where a resistance of the voltage divider is increased to reduce the power consumption and a capacitance of the capacitor is increased to improve the ripple reduction ratio, desired (high speed) charging/discharging characteristics can be obtained by suitably selecting the time constant of the charging/discharging current paths including the charging and discharging transistors.

BRIEF DESCRIPTION OF THE DRAWINGS

FIGS. 5 to 14 respectively show other embodiments of the present invention.

DETAILED DESCRIPTION OF THE PREFERRED EMBODIMENT

The preferred embodiment of the present invention will now be described with reference to the accompanying drawings.

Figure 1:
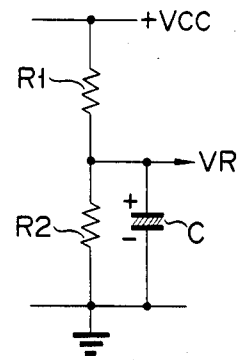
FIG. 1 shows a conventional charging/discharging circuit.
Figure 2:
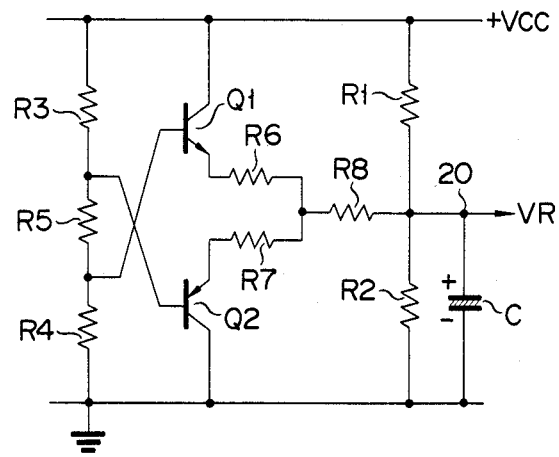
FIG. 2 shows an embodiment of a charging/discharging circuit according to the present invention.

FIG. 2 shows a typical configuration of a charging/discharging circuit according to the present invention. Series resistors R1 and R2 are connected between a power supply circuit +Vcc and a fixed potential circuit (circuit ground). Resistors R1 and R2 form a voltage divider. The junction between resistors R1 and R2 is connected to an output node 20. A reference potential VR for other linear circuit (not shown) is obtained from the node 20.

A capacitor C is connected in parallel to resistor R2. Series resistors R3 to R5 are connected between power supply circuit +Vcc and the circuit ground. Resistors R3 to R5 form a bias circuit for transistors Q1 and Q2. The base of NPN transistor Q1 is connected to the junction between resistors R4 and R5. The base of PNP transistor Q2 is connected to the junction between resistors R3 and R5. The collector of transistor Q1 is connected to power supply circuit +Vcc. The collector of transistor Q1 is circuit-grounded. The emitter of transistor Q1 is coupled via series resistors R6 and R7 to the emitter of transistor Q2. The junction between resistors R6 and R7 is coupled via a resistor R8 to output node 20.

Transistor Q1 serves to charge the capacitor C when the potential at node 20 is lower than the base potential of transistor Q1 so that transistor Q1 is rendered conductive. Transistor Q2 serves to discharge the capacitor C when the potential at node 20 is higher than the base potential of transistor Q2 so that transistor Q2 is rendered conductive.

A voltage drop across resistor R5 serves to reversely-bias both transistors Q1 and Q2, so that these transistors are completely turned off when the charging for capacitor C is finished and the potential at node 20 is in a prescribed steady state. This steady state is determined by resistors R1 and R2. The base potential of each of transistors Q1 and Q2 in the steady state, which is slightly different from reference potential VR, is determined by resistors R3 to R5.

Resistor R6 is used for adjusting the charging speed for capacitor C. Resistor R7 is used for adjusting the discharging speed for capacitor C. Resistor R8 is used for adjusting the charging/discharging speed for capacitor C.

The operation of the above charging/discharging circuit will be described. The resistances of resistors R5 to R8 are set much smaller than those of resistors R1 to R4. Suppose here that R1=R2 and R3=R4. When the power supply of +Vcc is turned on, the base potential of transistor Q1 quickly rises to about +Vcc/2. Meanwhile, since capacitor C is connected, the potential at output node 20 rises from zero volts upon charging of capacitor C. Assume that the base-emitter threshold voltage of transistor Q1 is represented by VBEQ1. Then, until the potential of capacitor C reaches +Vcc/2−VBEQ1, transistor Q1 remains ON. Since the resistances of resistors R6 and R8 are much smaller than that of resistor R1, capacitor C is rapidly charged mainly by a current flowing from transistor Q1. As the capacitor C is charged, the potential at output node 20 rises rapidly. When transistor Q1 is cut off at the end, capacitor C is charged through resistor R1. Then, the potential of output node 20 rises from +Vcc/2−VBEQ1 to voltage +Vcc/2 which is defined by the potential +Vcc and by the dividing ratio of resistors R1 and R2.

In the steady state, little current flows through resistors R1 to R5 and no current flows into capacitor C. Then, a ripple-free reference potential VR of +Vcc/2 is obtained with a little power consumption.

When power is cut off, charge stored in capacitor C is discharged through the current path of resistor R2 and through the current path of resistors R7 and R8 and transistor Q2. Assume that the base-emitter threshold voltage of transistor Q2 is represented by VBEQ2. Then, until the potential of capacitor C is decreased to VBEQ2, transistor Q2 is ON. Discharging of capacitor C is rapidly performed mainly through transistor Q2. As capacitor C is discharged, the potential of output node 20 is lowered quickly. When transistor Q2 is cut off, discharging of capacitor C is further performed through resistor R2. At the end, output node 20 is decreased to zero potential.

In the circuit described above, even where the ripple reduction ratio is improved by increasing the capacitance of capacitor C and the power consumption is reduced by increasing the resistances of resistors R1 and R2, high-speed charging through the path of transistor Q1 and high-speed discharging through the path of transistor Q2 is accomplished. Optional charging/discharging characteristics can be obtained by suitably selecting the time constant of the charging/discharging circuit.

Figure 3:
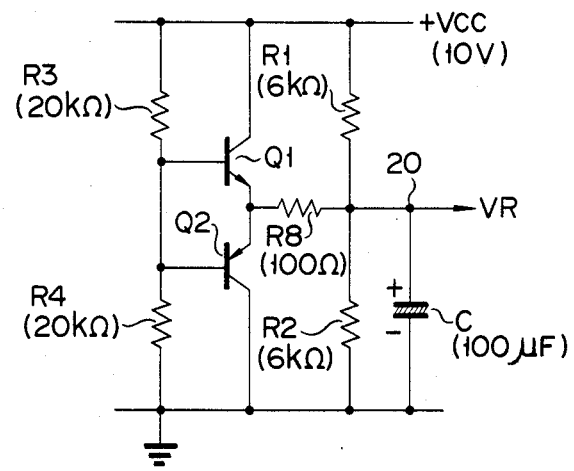
FIG. 3 shows another embodiment of the present invention.

FIG. 3 shows another embodiment of the charging/discharging circuit according to the present invention. In FIG. 3, resistors R5 to R7 are omitted (i.e., zero ohms are applied to R5 to R7). In this circuit, the following conditions are assumed: Vcc=10 V, R1=R2=6 k$\Omega$, R3=R4=20 k$\Omega$, R8=100 $\Omega$, and C=100 $\mu$F. Under these conditions, we have:

$$VR = \{R2/(R1+R2)\}Vcc = 0.5\ Vcc$$

Figure 4A:
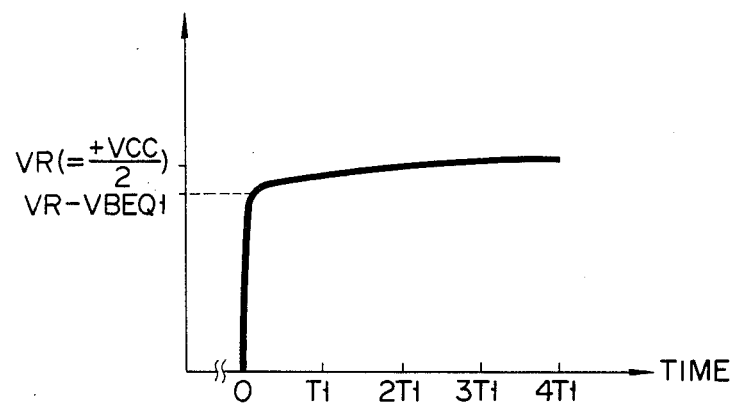
FIG. 4A is a graph showing a charging characteristic of the circuit shown in FIG. 3.
Figure 4B:
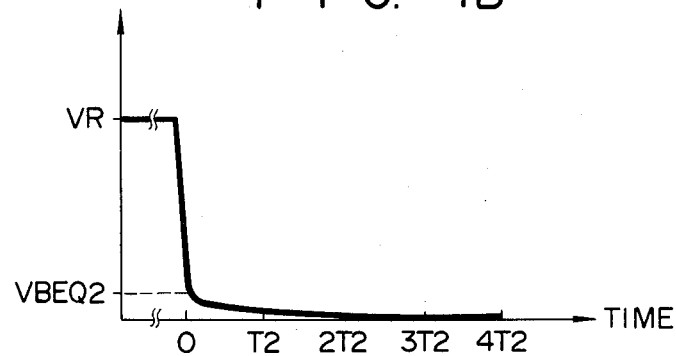
FIG. 4B is a graph showing a discharging characteristic of the circuit shown in FIG. 3.

FIG. 4A shows a charging characteristic of the circuit in FIG. 3, and FIG. 4B shows a discharging characteristic of the same. In the charging operation, until the output node potential reaches VR−VBEQ1, it rises along the curve of (VR—VBEQ1)(1−$e^{-t/T1'}$ and then, it rises according to (VR—VBEQ1) $e^{-t/T1}$. Since VBEQ1 is small (=0.7 V at most), T1′=R8×C=100 $\Omega$×100 $\mu$F=10 ms, and T1=R1×C=6 k$\Omega$×100 $\mu$F=0.6 sec, the rise time in the charging operation is seen to be short. In the discharging operation, until the output node potential reaches VBEQ2 (=0.7 V), it falls along the curve of VR.$e^{-t/T2'}$ and is then changed according to VBEQ2.$e^{-t/T2}$. Since T2′=R8×C=10 ms and T2=R2×C=0.6 sec, the fall time of the discharging operation is also seen to be short.

When it is assumed that the ripple frequency f is 100 Hz in the abovementioned circuit, impedance Zc of capacitor C at this frequency is given as:

$$Zc = |1/j2\pi fc| = |1/(2\pi \times 100 \times 100 \times 10^{-6})| = 15.9\ \Omega$$

Then, the ripple reduction ratio at output node 20 is given by:

$$R2||Zc/(R1+R2||Zc)$$

and is about −52 dB.

Resistor R8 in the circuit described above serves to determine the time constant of charging/discharging and also serves as a surge current protection resistor for transistors Q1 and Q2.

In the circuit described above, transistors Q1 and Q2 are both OFF in the steady state. When R3=R4 and VBEQ1=VBEQ2=VBEQ, the peak value of an over-level ripple component of the power supply potential, which peak value turns on the transistors Q1 and Q2, is given to be 2×2VBEQ=2.8 V. When only one power supply is used, since the ripple component is generally smaller than the peak value of 2.8 V, no practical problem will occure. When two power supplies are used, then a negative potential −VEE is used for the second power supply, VR is set at ground potential, and the condition |Vcc|=|VEE| is met. Then, no problem is involved. However, the condition |Vcc|≠|VEE| may be set when two power supplies are used. In this case, the power supply voltage range in which transistor Q1 or Q2 is kept OFF (steady state) is narrowed.

Figure 5:
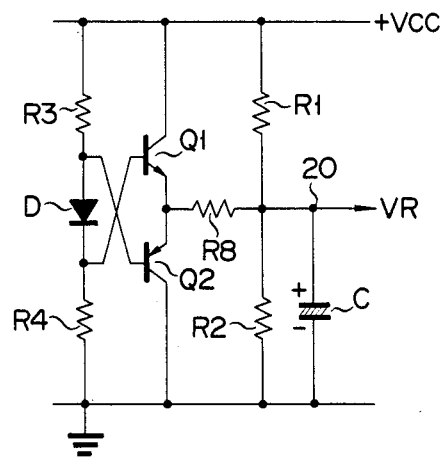

In order to solve the above problem, in a charging/discharging circuit shown in FIG. 5, a diode D (having a forward-biased impedance corresponding to the resistance of resistor R5 in FIG. 2) is used. In this circuit, the base potential of transistor Q1 is set to be lower than that of transistor Q2 in the steady state. By the use of diode D, the power supply voltage range wherein transistors Q1 and Q2 are OFF is widened, thereby the circuit of FIG. 5 being applicable to various power supply voltages of +Vcc and −VEE.

In order to widen the power supply voltage range in which transistors Q1 and Q2 are kept OFF, a charging/discharging circuit shown in FIG. 6 has the following configuration.

In FIG. 6, resistor R5 (e.g., 1 k$\Omega$), resistor R6 (e.g., 100 $\Omega$), and resistor R7 (e.g., 200 $\Omega$) are provided in the circuit of FIG. 3. Resistor R8 is omitted here for simplicity. Series diodes D1 and D2 are connected between the base of transistor Q1 and output node 20 for surge current protection of transistor Q1. Other series diodes D3 and D4 are connected between the base of transistor Q2 and output node 20 for surge current protection of transistor Q2. In this case, the resistances of resistors R6 and R7 are set to be different from each other so as to provide different charging and discharging time constants.

In a charging/discharging circuit shown in FIG. 7, resistor R9 (e.g., 500 Ω) is inserted between the collector of transistor Q1 and the +Vcc power supply. Resistor R9 serves to protect the transistor Q1 from a surge current. Resistor R10 (e.g., 500 Ω) is inserted between the collector of transistor Q2 and the circuit ground. Resistor R10 serves to protect the transistor Q2 from a surge current. Diode D5 is connected in series to resistor R1 and diode D5 is connected in series to resistor R2. Diodes D5 and D6 serve to provide desired voltage drops in the resistor circuit of R1 and R2.

FIG. 8 shows a modification of FIG. 3. In FIG. 8, the active charging circuit for capacitor C is formed of a Darlington-connected NPN transistors Q1A and Q1B, and the active discharging circuit for capacitor C is formed of a Darlington-connected PNP transistors Q2A and Q2B.

FIG. 9 shows another modification of FIG. 3. In FIG. 9, resistors R1 and R2 are used not only for defining the stationary potential VR but for biasing the transistors Q1 and Q2 at the time when the charging or discharging for capacitor C is effected. Accordingly, resistors R3 and R4 in FIG. 3 can be omitted, but resistors R11 and R12 are used in place of resistors R3, R4 and R8 of FIG. 3. Arrows Ic, Id and Is respectively denote the flow of charging current, the flow of discharging current and the flow of stationary biasing current for capacitor C. (Current Is is substantially zero in the stationary state.)

Figure 10:
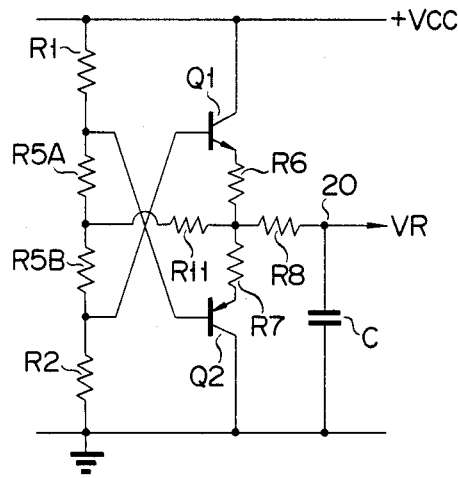

FIG. 10 is a modification of FIG. 9. FIG. 10 circuit utilizes the same concept as that utilized in FIG. 2. Thus, resistors R1 and R2 of FIG. 10 correspond to resistors R3 and R4 of FIG. 2, respectively, and resistors R5A and R5B of FIG. 10 correspond to resistor R5 of FIG. 2.

Figure 11:
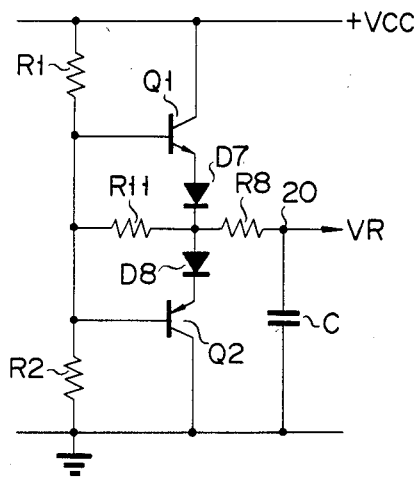

FIG. 11 is a modification of FIG. 9. In FIG. 11, a diode D7 is connected in series to the emitter circuit of transistor Q1, and a diode D8 is connected in series to the emitter circuit of transistor Q2. Diodes D7 and D8 are effective to improve the insensitiveness of transistors Q1 and Q2 for large ripples involved in the power supply potential +Vcc.

Figure 12:
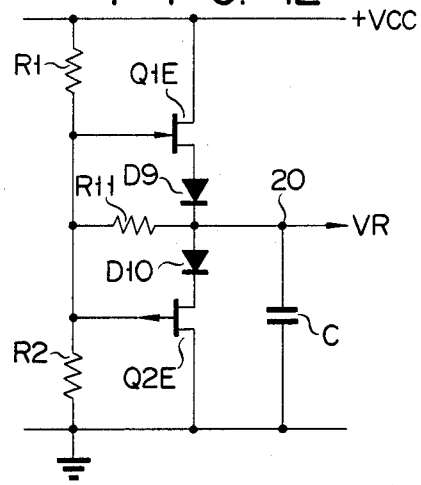

FIG. 12 is a modification of FIG. 11. In FIG. 11, a Pch FET Q1E and Nch FET Q2E are used in place of bipolar transistors Q1 and Q2 in FIG. 11. FETs Q1E and Q2E are preferably an enhancement type, but a depletion type may be used.

Figure 13:
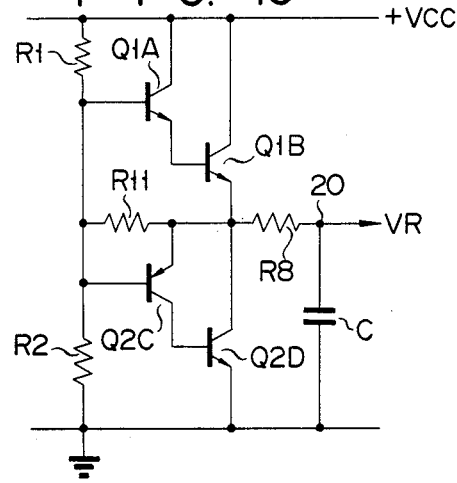

FIG. 13 is a modification of FIG. 9. FIG. 13 circuit utilizes substantially the same concept as that utilized in FIG. 8. Thus, in FIG. 13, the active charging circuit for capacitor C is formed of a Darlington-connected NPN transistors Q1A and Q1B, and the active discharging circuit for capacitor C is formed of an inverted-Darlington-connected PNP and NPN transistors Q2C and Q2D.

Figure 14:
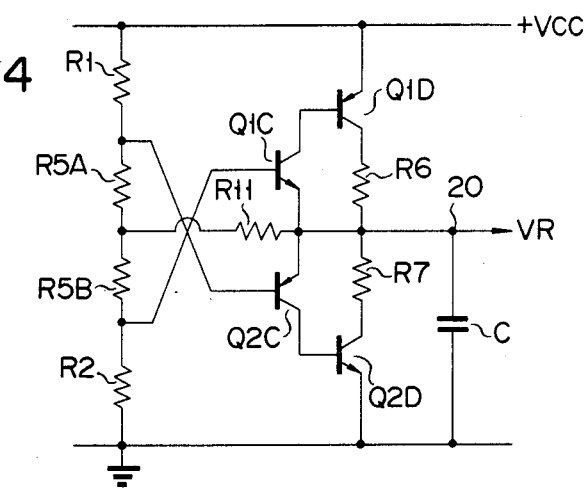

FIG. 14 is a modification of FIG. 10. FIG. 14 circuit utilizes the same concept as that utilized in FIG. 2. Thus, resistors R5A and R5B of FIG. 14 correspond to resistor R5 of FIG. 2. In FIG. 14, NPN and PNP transistors Q1C and Q1D are inverted-Darlington-connected and PNP and NPN transistors Q2C and Q2D are inverted-Darlington-connected.

In summary, according to the charging/discharging circuit of the present invention, contradictory requirements of a good ripple reduction ratio at the reference potential output node 20 and optional charging/discharging characteristics for the capacitor C are satisfied under small power consumption. In addition, the potential at the reference potential output node in the steady state is stable. Accordingly, a charging/discharging circuit of the present invention may be suitably adapted for providing a center potential or reference potential of, e.g., a bipolar monolithic linear amplifier.

What is claimed is:

1. A charging/discharging circuit, comprising:
   voltage divider means coupled between a power supply circuit and a fixed potential circuit and having an output node, for voltage-dividing a power supply potential difference between the power supply circuit and the fixed potential circuit, and providing at the output node a reference potential corresponding to said power supply potential difference;
   a capacitor coupled between said output node and said fixed potential circuit;
   charging means coupled between said power supply circuit and said output node and being responsive to a potential at said output node, for feeding a charge current from said power supply circuit to said capacitor means when said power supply potential difference has a given high value and the potential at said output node is lower than a first given potential which corresponds to said reference potential, said charging means stopping the feeding of said charge current when the potential at said output node exceeds said first given potential; and
   discharging means coupled between said fixed potential circuit and said output node and being responsive to the potential at said output node, for feeding a discharge current from said capacitor means to said fixed potential circuit when said power supply potential difference has a given low value and the potential at said output node exceeds a second given potential which is lower than said first given potential, said discharging means stopping the feeding of said discharge current when the potential at said output node is lower than said second given potential.

2. A charging/discharging circuit according to claim 1, further comprising:
   bias means coupled between said power supply circuit and said fixed potential circuit, for voltage-dividing said power supply potential difference to provide a potential defining said first given potential when said power supply potential difference has said given high value.

3. A charging/discharging circuit according to claim 2, further comprising:
   charge time constant adjusting means inserted between said charging means and said output node, for adjusting the charging speed for said capacitor means.

4. A charging/discharging circuit according to claim 3, further comprising:
   discharge time constant adjusting means inserted between said discharging means and said output node, for adjusting the discharging speed for said capacitor means.

5. A charging/discharging circuit according to claim 2, wherein said voltage divider means includes:

a first resistor coupled between said power supply circuit and said output node; and a second resistor coupled between said output node and said fixed potential circuit, the DC resistance value of the series-connected first and second resistors being selected such that a DC current flowing through the series-connected first and second resistors is far smaller than said charge current, and wherein said capacitor means includes a capacitor coupled in parallel to said second resistor, the capacitance value of said capacitor being selected such that the time constant formed by said first and second resistors and said capacitor is effective to reduce ripples involved in said power supply potential difference.

6. A charging/discharging circuit according to claim 5, wherein said bias means includs:

a first bias resistor having one end being connected to said power supply circuit; and a second bias resistor connected between the other end of said first bias resistor and said fixed potential circuit, the DC resistance value of the series-connected first and second bias resistors being selected such that a DC current flowing through the series-connected first and second bias resistors is far smaller than said charge current, wherein said charging means includes a first conductivity type transistor having a base coupled to the connection between said first and second bias resistors, a collector coupled to said power supply circuit and an emitter coupled to said output node, and wherein said discharging means includes a second conductivity type transistor having a base coupled to the connection between said first and second bias resistors, a collector coupled to said fixed potential circuit and an emitter coupled to said output node.

7. A charging/discharging circuit according to claim 6, further comprising:

charge time constant adjusting means inserted between said charging means and said output node, for adjusting the charging speed for said capacitor means.

8. A charging/discharging circuit according to claim 7, further comprising:

discharge time constant adjusting means inserted between said discharging means and said output node, for adjusting the discharging speed for said capacitor means.

9. A charging/discharging circuit according to claim 6, wherein said bias means includs:

a third bias resistor inserted between said first and second bias resistors, the connection between said first and third bias resistors being coupled to the base of said second conductivity type transistor, and the connection between said second and third bias resistors being coupled to the base of said firstd conductivity type transistor.

10. A charging/discharging circuit according to claim 6, wherein said bias means includes:

a bias diode inserted between said first and second bias resistors, so that said bias diode is forwardly biased by said power supply potential difference, the connection between said bias diode and said first bias resistor being coupled to the base of said second conductivity type transistor, and the connection between said bias diode and said second bias resistor being coupled to the base of said first conductivity type transistor.

11. A charging/discharging circuit according to claim 8, wherein said charging means is provided with:

first diode means coupled between the base of said first conductivity type transistor and said output node, for limiting a potential difference between the base of said first conductivity type transistor and said output node at a first given value when the base to emitter path of said first conductivity type transistor is forwardly biased, and wherein said discharging means is provided withs econd diode means coupled between the base of said second conductivity type transistor and said output node, for limiting a potential difference between the base of said second conductivity type transistor and said output node at a second given value when the base to emitter path of said second conductivity type transistor is forwardly biased.

12. A charging/discharging circuit according to claim 5, wherein said voltage divider means includes:

a first diode connected in series to said first resistor; and a second diode connected in series to said second resistor, said first and second diodes being forwardly biased by said power supply potential difference.

13. A charging/discharging circuit according to claim 1, wherein said voltage divider means includes:

a first resistor having one end being connected to said power supply circuit;

a second resistor connected between the other end of said first resistor and said fixed potential circuit, the DC resistance value of the series-connected first and second resistors being selected such that a DC current flowing through the series-connected first and second resistors is far smaller than said charge current; and a third resistor coupled between said output node and a specific node connected to said first and second resistors, and wherein said charging means includes a first conductivity type transistor having a base coupled to said specific node, a collector coupled to said power supply circuit and an emitter coupled to said output node, and wherein said discharging means includes a second conductivity type transistor having a base coupled to said specific node, a collector coupled to said fixed potential circuit and an emitter coupled to said output node.

14. A charging/discharging circuit according to claim 13, wherein said charging means is provided with:

first voltage drop means connected in series to the emitter of said first conductivity type transistor, and wherein said discharge means is provided with:

second voltage drop means connected in series to the emitter of said second conductivity type transistor, said first and second voltage drop means being connected in seried between the the emitter of said first conductivity type transistor and the emitter of said second conductivity type transistor, and said reference potential being derived from the connection between said first and second voltage drop means.

* * * * *

UNITED STATES PATENT AND TRADEMARK OFFICE
CERTIFICATE OF CORRECTION

PATENT NO. : 4,555,655
DATED : November 26, 1985
INVENTOR(S) : Tatsuo Tanaka

It is certified that error appears in the above-identified patent and that said Letters Patent is hereby corrected as shown below:

Claim 6, line 2, change "includs" to -- includes --;

Claim 9, line 2, change "includs" to -- includes --;

Claim 9, line 8, change "firstd" to -- first --;

Claim 11, line 10, change "withs" to -- with --; and

Claim 11, line 11, change "econd" to -- second --.

Signed and Sealed this

Second Day of September 1986

[SEAL]

Attest:

DONALD J. QUIGG

Attesting Officer

Commissioner of Patents and Trademarks